United States Patent
Nakajima et al.

(10) Patent No.: US 6,388,938 B2
(45) Date of Patent: May 14, 2002

(54) SEMICONDUCTOR MEMORY DEVICE

(75) Inventors: Takao Nakajima, Yamato; Makoto Segawa, Yokohama, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/812,362

(22) Filed: Mar. 20, 2001

(30) Foreign Application Priority Data

Mar. 28, 2000 (JP) .......................................... 2000-89702

(51) Int. Cl.$^7$ ................................................ G11C 8/00

(52) U.S. Cl. ............................ 365/230.03; 365/189.01; 365/190

(58) Field of Search ............................ 365/230.03, 190, 365/154, 189.01

(56) References Cited

U.S. PATENT DOCUMENTS 5,864,505 A * 1/1999 Higuchi .................. 365/230.03
6,088,284 A * 7/2000 Lee et al. ............... 365/230.03

FOREIGN PATENT DOCUMENTS

JP          4-159689      6/1992

* cited by examiner

*Primary Examiner*—Tan T. Nguyen
(74) *Attorney, Agent, or Firm*—Hogan & Hartson, L.L.P.

(57) ABSTRACT

There is provided a semiconductor memory device capable of preventing the deterioration of access characteristics between output signal lines. The semiconductor memory device comprises: first and second cell arrays, each of which has the same number of memory cells; first through ($2n-1$)-th ($n \geq 1$) output selection control circuits; first through ($2n-1$)-th output transistor circuits which are provided so as to correspond to the first through ($2n-1$)-th output selection control circuits, and each of which receives the output of a corresponding one of the output transistor circuits; and first through ($4n-2$)-th output signal lines, each of the first and second cell arrays being divided into k ($k \geq 2$) first through k-th section parts, each of which has $2n-1$ first through ($2n-1$)-th output parts and at least one auxiliary input/output part, the i-th ($i=1, \ldots, n-1$) output selection control part receiving the output of the ($2i-1$)-th input/output part of each of the first through k-th section parts of the first cell array via the ($2i-1$)-th output signal line and receiving the output of the $2i$-th input/output part of each of the first through k-th section parts of the first cell array via the $2i$-th output signal line, the n-th output selection control part receiving the output of the ($2n-1$)-th input/output part of each of the first through k-th section parts of the first cell array via the ($2n-1$)-th output signal line and receiving the output of the auxiliary input/output part of each of the section parts of the first cell array via the $2n$-th output signal line, and the ($n+i$)-th ($i=1, \ldots, n-1$) output control circuit receiving the output of the ($2i-1$)-th input/output part of each of the first through k-th section parts of the second cell array via the ($2n+2i-1$)-th output signal line and receiving the output of the $2i$-th input/output part of each of the first through k-th section parts of the second cell array via the ($2n+2i$)-th output signal line.

2 Claims, 13 Drawing Sheets

CONSTRUCTION OF SECTION PART ON CELL ARRAY $Ar_1$ SIDE

CONNECT TO OUTPUT SIGNAL LINE OF $I/O_{(n+1)/2}$ IN CELL ARRAY $Ar_2$ IN FIG. 11

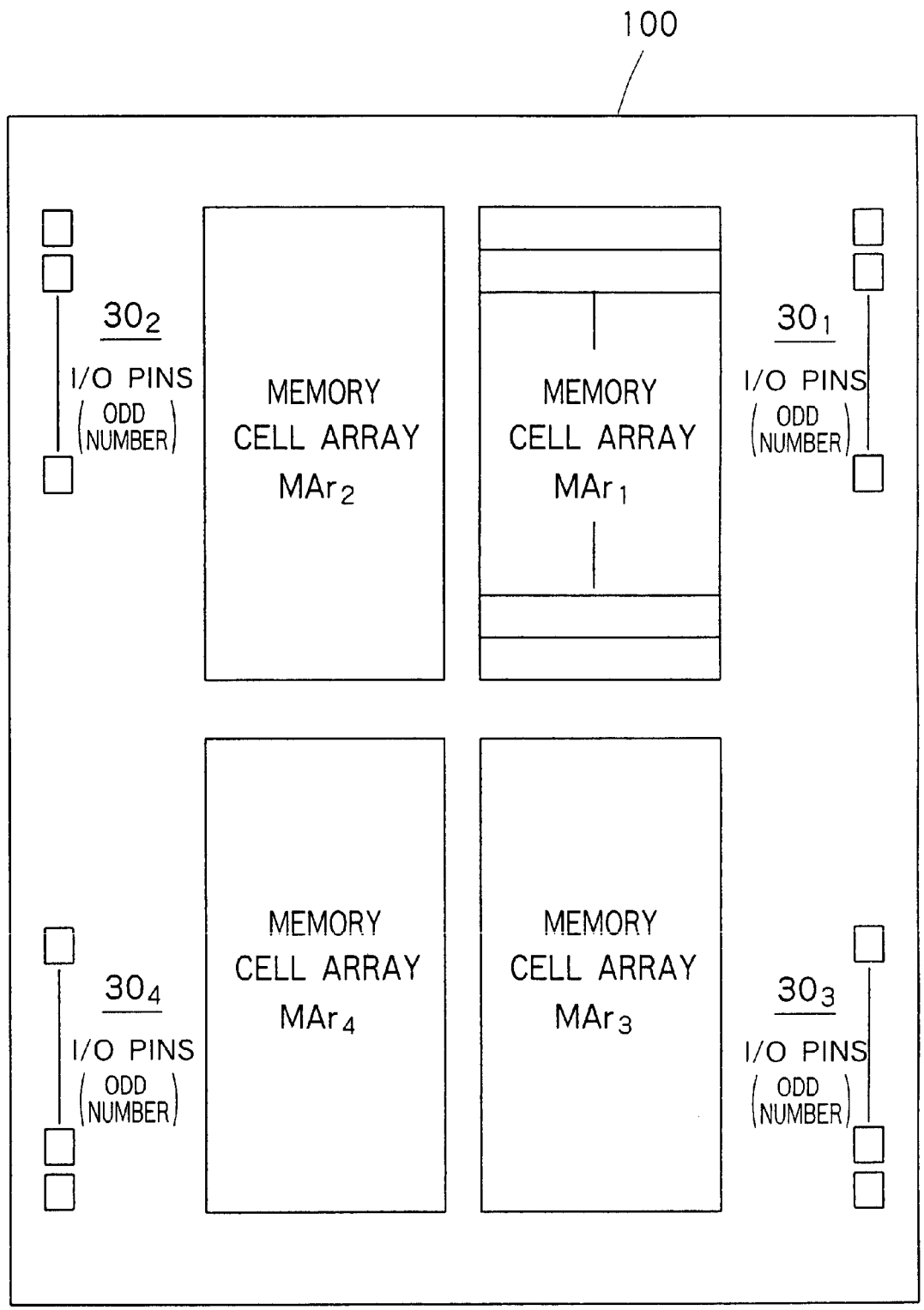
F I G. 14

SEMICONDUCTOR MEMORY DEVICE

CROSS REFERENCE TO RELATED APPLICATION

This application claims benefit of priority under 35 USC §119 to Japanese Patent Application No. 2000-89702, filed on Mar. 28, 2000, the contents of which are incorporated by reference herein.

BACKGROUND OF THE INVENTION

1. Field of the Invention

The present invention relates generally to a semiconductor memory device.

2. Description of Related Art

Generally, in the design for semiconductor memory devices such as SRAMs (Static Random Access Memories), products, which have different bit configurations even if their storage capacities are the same, are designed at the same time at a customer's request. For example, with respect to an SRAM having a storage capacity of 9 Mbits, its bit configurations including redundant divisions are various configurations, such as 256 kwords×36 bits or 512 kwords×18 bits, in accordance with its uses.

Usually, such products having different bit configurations are realized by changing a wiring layer by switching a mask for a specific in the same chip.

The layout of a memory cell array of a typical SRAM is shown in FIG. 4. In this SRAM, a memory cell array is divided into two cell arrays $A_{r1}$ and $A_{r2}$ on a chip. Each of the cell arrays $A_{ri}$ (i=1, 2) comprises k section parts $S_1, \ldots, S_k$. Each of the section parts $S_i$ (i=1, . . . , k) of the cell array $A_{r1}$ has n input/output part I/O$_1$, . . . , I/O$_n$, and each of the section parts $S_j$ (j=1, . . . , k) of the cell array $A_{r2}$ has n input/output parts I/O$_{n+1}$, . . . , I/O$_{2n}$.

The construction of a conventional semiconductor memory device having the layout of the memory cell shown in FIG. 4 is shown in FIG. 5. In this conventional semiconductor memory device, the n input/output parts I/O$_1$, . . . , I/O$_n$ of each of the section parts $S_i$ (i=1, . . . , k) of the cell array $A_{r1}$ are connected to one ends of first through n-th output signal lines, and the n input/output parts I/O$_1$, . . . , I/O$_n$ of each of the section parts $S_j$ (j=1, . . . , k) of the cell array $A_{r2}$ are connected to one ends of (n+1)-th through 2n-th output signal lines. That is, the j-th (j=1, . . . , n) input/output part I/O$_j$ of the section part $S_i$ (i=1, . . . , k) of the cell array $A_{r1}$ is connected to one end of the j-th output signal line, and the j-th (j=1, . . . , k) input/output part I/O of the section part $S_i$ (i=1, . . . , k) of the cell array $A_{r2}$ is connected to one end of the (n+j)-th output signal line.

The above described semiconductor memory device also has 2n output control circuits $3_1, \ldots, 3_{2n}$, and 2n output transistor circuits (which will be also hereinafter referred to as output $T_r$ circuits) $5_1, \ldots, 5_{2n}$. The other end of the i-th (i=1, . . . , 2n) output signal line is connected to the output control circuit $3_i$.

Therefore, the i-th (i=1, . . . , n) input/output part I/O$_i$ of each of the section parts $S_1, \ldots, S_k$ of the cell array $A_{r1}$ is connected to the output control circuit $3_i$ via the i-th output signal line, and the i-th (i=1, . . . , n) input/output part I/O$_i$ of each of the section parts $S_1, \ldots, S_k$ of the cell array $A_{r2}$ is connected to the output control circuit $3_{n+i}$ via the (n+i)-th output signal line. The output of the output control circuit $3_i$ (i=1, . . . , 2n) is fed to a corresponding output Tr circuit $5_i$.

In the semiconductor memory device shown in FIG. 5, the total wiring capacity of the respective output signal lines is constant with respect to any one of the section parts or any one of the input/output parts.

The construction of another conventional semiconductor memory device having the layout of the memory cell array shown in FIG. 4 is shown in FIG. 6. In this semiconductor memory device, an additional signal Ad is newly introduced into the semiconductor memory device shown in FIG. 5, to select a cell array $A_{r1}$ by the additional signal Ad and to select a cell array $A_{r2}$ by the additional signal /Ad which is the inverted signal of the additional signal Ad. In addition, n selecting circuits $4_1, \ldots, 4_n$ are newly provided between 2n output control circuits $3_1, \ldots, 3_{2n}$ and n output Tr circuits $5_1, \ldots, 5_n$.

The selecting circuit $4_i$ (i=1, . . . , n) is designed to select the output of the output control circuit $3_i$ or the output of the output control circuit $3_{n+i}$ on the basis of the additional signal Ad to transmit the selected output to a corresponding output Tr circuit $5_i$.

With this construction, assuming that the word length of the semiconductor memory device shown in FIG. 5 is $W_L$, the semiconductor memory device shown in FIG. 6 is a product having a bit configuration of $2W_L \times n$. Furthermore, the semiconductor memory device shown in FIG. 5 is a product having a bit configuration of $W_L \times 2n$.

The conventional semiconductor memory device shown in FIG. 6 uses half (=n/2) the n output transistor circuits on the side of the cell array $A_{r1}$, and does not use the remaining half the output transistor circuits, although this depends on the pin arrangement of the package. This is the same with respect to the n output transistor circuits on the side of the cell array $A_{r2}$. That is, the semiconductor memory device uses half the n output transistor circuits $5_1, \ldots, 5_n$ in FIG. 5, e.g., the output transistor circuits $5_1, \ldots, 5_{n/2}$, as the output transistor circuits of the cell array $A_{r1}$ of FIG. 6, and uses half the n output transistor circuits $5_{n+1}, \ldots, 5_{2n}$, e.g., the output transistor circuits $5_{n+1}, \ldots, 5_{3n/2}$, while it does not use the other transistor circuits.

Since the layout shown in FIG. 4 is used when the semiconductor memory device shown in FIG. 6 is produced by changing an AL wiring such as an AL master slice, it is required to newly draw an output line 15 of each of the output control circuits $3_i$ (i=1, . . . , 2n) as shown in FIG. 6.

For that reason, in the conventional semiconductor memory device shown in FIG. 6, the characteristics of access time are deteriorated by the delay time of the wiring 15 in comparison with the construction of the semiconductor memory device shown in FIG. 5. This deterioration of the characteristics of access time is more remarkable as the capacity of the memory device increases since the length of the drawn wiring increases.

The construction of a further conventional semiconductor memory device having the layout of the memory cell shown in FIG. 4 is shown in FIG. 7. In this semiconductor memory device, an additional signal Ad is newly introduced into the semiconductor memory device shown in FIG. 5, to select a cell array $A_{r1}$ by the additional signal Ad and to select a cell array $A_{r2}$ by an additional signal /Ad. The i-th (i=1, . . . , n) input/output part I/O$_i$ of each of k section parts $S_1, \ldots, S_k$ of the cell array $A_{r1}$ is connected to an output selecting circuit $2_i$ via the first output signal line, and the i-th (i=1, . . . , n) input/output part I/O$_i$ of each of k section parts $S_1, \ldots, S_k$ of the cell array $A_{r2}$ is connected to the output selecting circuit $2_i$ via the (n+i)-th output signal line.

Each of the output selecting circuits $2_i$ (i=1, . . . , n) is designed to select the output of the cell array $A_{r2}$, which is transmitted via the i-th output signal line, or the output of the cell array $A_{r2}$ which is transmitted via the (n+i)-th output line, on the basis of the additional signal Ad to transmit the selected output to a corresponding output transistor $5_i$.

The semiconductor memory device shown in FIG. 7 has output control circuits $2_1, \ldots, 2_n$, and output transistor circuits $5_1, \ldots, 5_n$. The semiconductor memory device shown in FIG. 7 is a product having a bit configuration of 2WL×n similar to the semiconductor memory device shown in FIG. 6.

However, in the semiconductor memory device shown in FIG. 7, it is required to draw an output signal line 16 from the side of the cell array $A_{r2}$ to the output selection control circuits $2_1, \ldots, 2_n$ as shown in FIG. 7, so that the length of the output signal line is longer than that of the conventional semiconductor memory device shown in FIG. 5. For that reason, the characteristics of access time are deteriorated similar to the semiconductor memory device shown in FIG. 6.

In order to prevent such deterioration of the characteristics of access time, a semiconductor memory device shown in FIG. 8 is considered. The semiconductor memory device shown in FIG. 8 is constructed so as to obtain a product having a bit configuration of $2 \cdot W_L \times n$ by introducing an additional signal Ad. In this semiconductor memory device, the (2i−1)-th (i=1, ..., n/2) input/output part of each of k section parts $S_1, \ldots, S_k$ of a cell array $A_{r1}$ is connected to an output selection control circuit $2_i$ via the (2i−1)-th output signal line, and the 2i-th input/output part is connected to the output selection control circuit $2_i$ via the 2i-th output signal line. In addition, the (2i−1)-th (i=1, ..., n/2) input/output part of each of k section parts $S_1, \ldots, S_k$ of a cell array $A_{r2}$ is connected to an output selection control circuit $2_{n/2+i}$ via the (n/2+2i)-th output signal line, and the 2i-th input/output part is connected to the output selection control circuit $2_{n/2+i}$ via the (n/2+2I)-th output signal line.

In each of the output selection control circuits $2i$ (i=1, ..., n), any one of the inputs is selected on the basis of the additional signal Ad or an additional signal /Ad, and the selected input is transmitted to a corresponding output transistor $5i$.

This semiconductor memory device has output selection control circuits $2_1, \ldots, 2_n$, and output transistor circuits $5_1, \ldots, 5_n$.

Therefore, in the semiconductor memory device shown in FIG. 8, each of the section parts $S_i$ (i=1, ..., k) has two input/output part I/O$_m$ connected to the same output selection control circuit $2m$ (m=1, ..., n/2) as shown in FIG. 9. It is determined by the additional signal Ad or additional signal /Ad which of the two input/output parts I/O$_m$ is selected.

While the section part S1 of the cell array Ar1 has been shown in FIG. 9 for simple explanation, this is the same with respect to other section parts.

In the semiconductor memory device shown in FIG. 8, the length of the output signal line is the same as that of the semiconductor memory device shown in FIG. 5, so that it is possible to inhibit the characteristics of access time from deteriorating.

However, as can be clearly seen from the above description, this is effective if only the number n of input/output parts I/O$_n$ of one section part is even, and it is not effective when the number n is odd.

When the number n is odd, one input/output part, which is not selected by a set of an additional signal $A_d$ and an additional signal /$A_d$, exists in each of the section parts $S_i$ (i=1, ..., k) of the cell array $A_{r1}$ as shown in FIG. 10. In addition, as shown in FIG. 11, one input/output part, which is not selected by a set of an additional signal $A_d$ and an additional signal /$A_d$, exists in each of the section parts $S_i$ (i=1, ..., k) of the cell array $A_{r2}$.

For that reason, as shown in FIG. 12, in the semiconductor memory device when the number n is odd, the input/output parts must be arranged so as to extend over the cell arrays $A_{r1}$ and $A_{r2}$, so that it is required to draw an output signal line 20 only with respect to a specific one input/output part. Thus, the characteristics of access time in the specific input/output part (the input/output part I/O$_{(n+1)2}$ in FIG. 12) are deteriorated.

It is well known that the number of input/output parts of each of cell arrays is odd in actual semiconductor memory device. Referring to FIGS. 13 and 14, this will be described below.

FIG. 13 is a plan view of a package having four sets of I/O pin groups, each of which has odd I/O pins. FIG. 14 is a layout drawing showing the construction of a chip for use in the package shown in FIG. 13. Four memory cell arrays $MA_{r1}, \ldots, MA_{r4}$ exist substantially at the central portion of a chip 100 for use in this package, and pad groups $30_1, 30_2, 30_3$ and $30_4$, each of which comprises odd pads, are provided in the vicinity of the respective memory cell arrays. Each of the pad groups $30i$ (i=1, ..., 4) is connected to the I/O pin group 40 shown in FIG. 13 by means of a wire bonding or the like, and connected to the memory cell array $MA_{ri}$. Therefore, each of the section parts $S_1, \ldots, S_k$ constructing the memory cell array $MA_{ri}$ (i=1, ..., 4) has odd input/output parts.

SUMMARY OF THE INVENTION

It is therefore an object of the present invention to eliminate the aforementioned problems and to provide a semiconductor memory device capable of preventing access characteristics from deteriorating between output signal lines.

In order to accomplish the aforementioned and other objects, according to one aspect of the present invention, a semiconductor memory device comprises: first and second cell arrays, each of which has the same number of memory cells; first through (2n−1)-th (n≧1) output selection control circuits; first through (2n−1)-th output transistor circuits which are provided so as to correspond to the first through (2n−1)-th output selection control circuits, and each of which receives the output of a corresponding one of the output transistor circuits; and first through (4n−2)-th output signal lines, each of the first and second cell arrays being divided into k (k≧2) first through k-th section parts, each of which has 2n−1 first through (2n−1)-th output parts and at least one auxiliary input/output part, the i-th (i=1, ..., n−1) output selection control part receiving the output of the (2i−1)-th input/output part of each of the first through k-th section parts of the first cell array via the (2i−1)-th output signal line and receiving the output of the 2i-th input/output part of each of the first through k-th section parts of the first cell array via the 2i-th output signal line, the n-th output selection control part receiving the output of the (2n−1)-th input/output part of each of the first through k-th section parts of the first cell array via the (2n−1)-th output signal line and receiving the output of the auxiliary input/output part of each of the section parts of the first cell array via the 2n-th output signal line, and the (n+i)-th (i=1, ..., n−1) output control circuit receiving the output of the (2i−1)-th input/output part of each of the first through k-th section parts of the second cell array via the (2n+2i−1)-th output signal line and receiving the output of the 2i-th input/output part of each of the first through k-th section parts of the second cell array via the (2n+2i)-th output signal line.

Preferably, the first through (2n−1)-th output selection control circuits selects one of two input signals on the basis of an additional signal, and transmits the selected signal to a corresponding one of the output transistor circuits.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 14 is a layout drawing showing the construction of the semiconductor package shown in FIG. 13.

DESCRIPTION OF THE PREFERRED EMBODIMENTS

Figure 1:
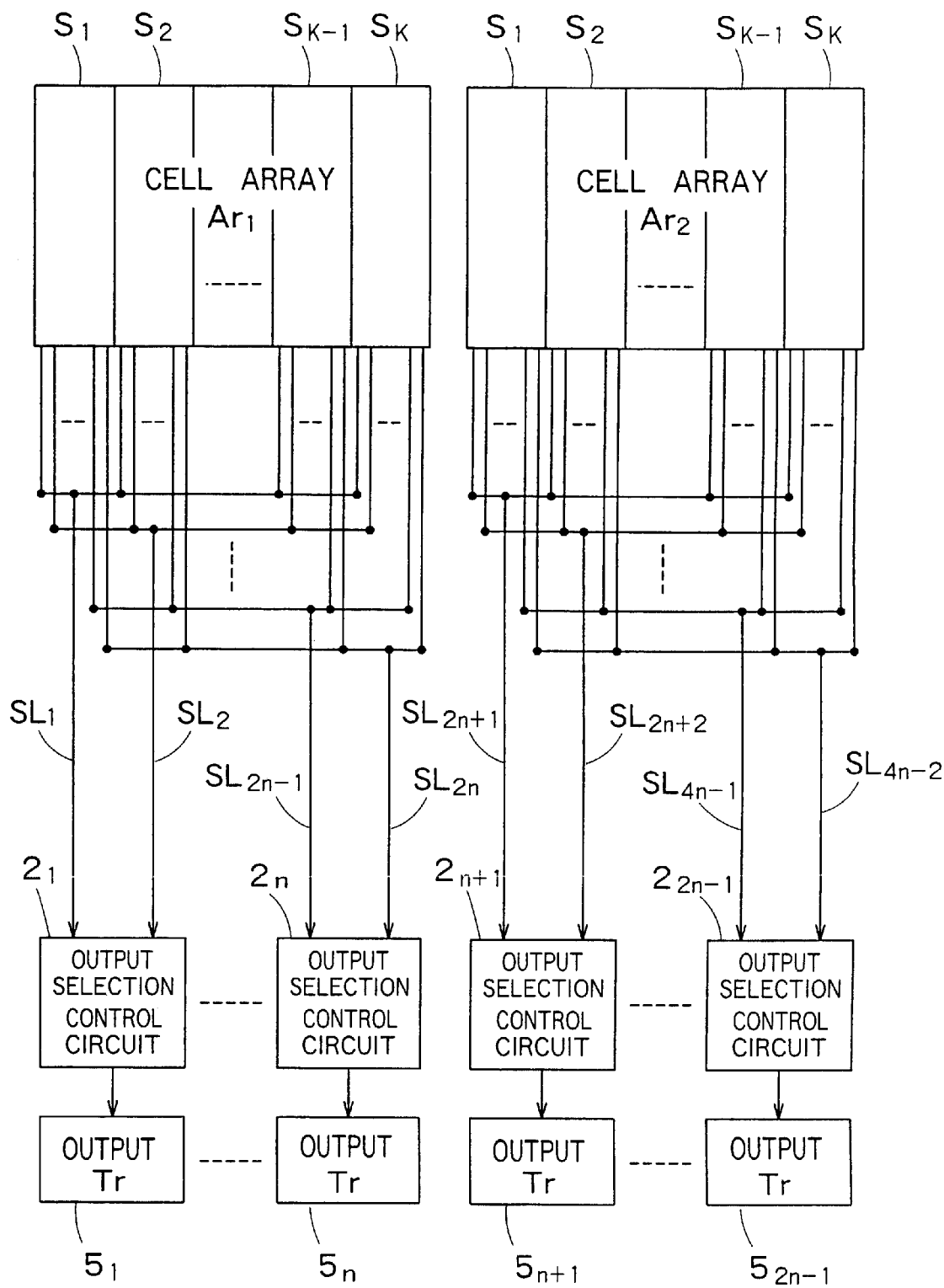
FIG. 1 is a block diagram showing a preferred embodiment of a semiconductor memory device according to the present invention.
Figure 2:
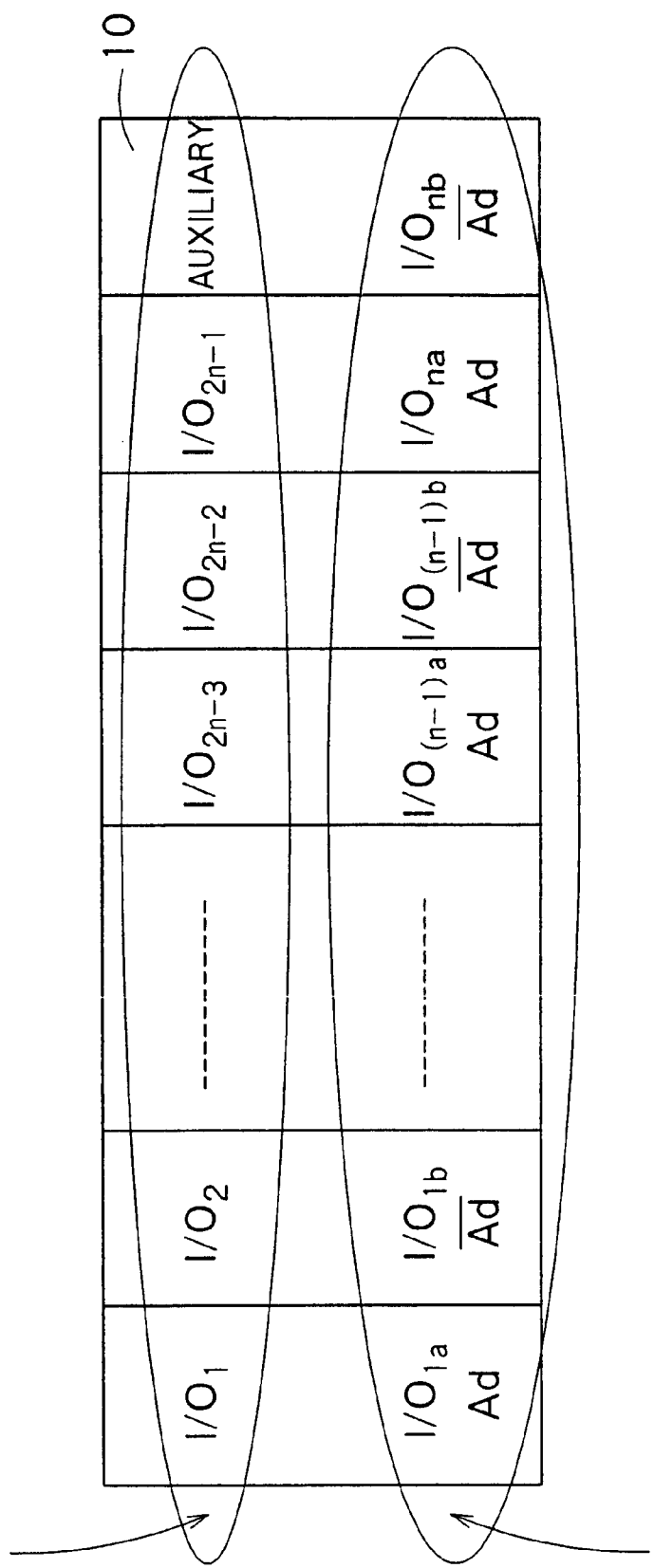
FIG. 2 is a block diagram showing the construction of a cell array $A_{r1}$ in the preferred embodiment shown in FIG. 1.
Figure 3:
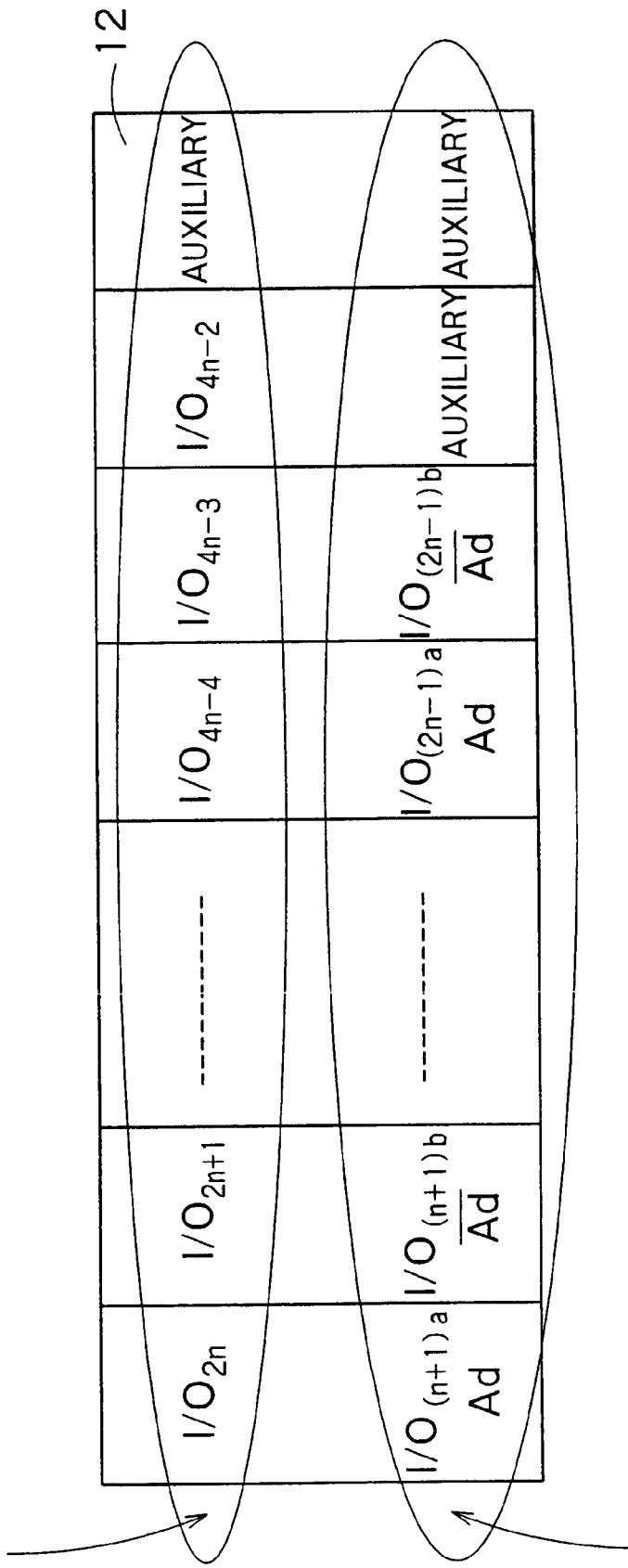
FIG. 3 is a block diagram showing the construction of a cell array $A_{r2}$ in the preferred embodiment shown in FIG. 1.
Figure 4:
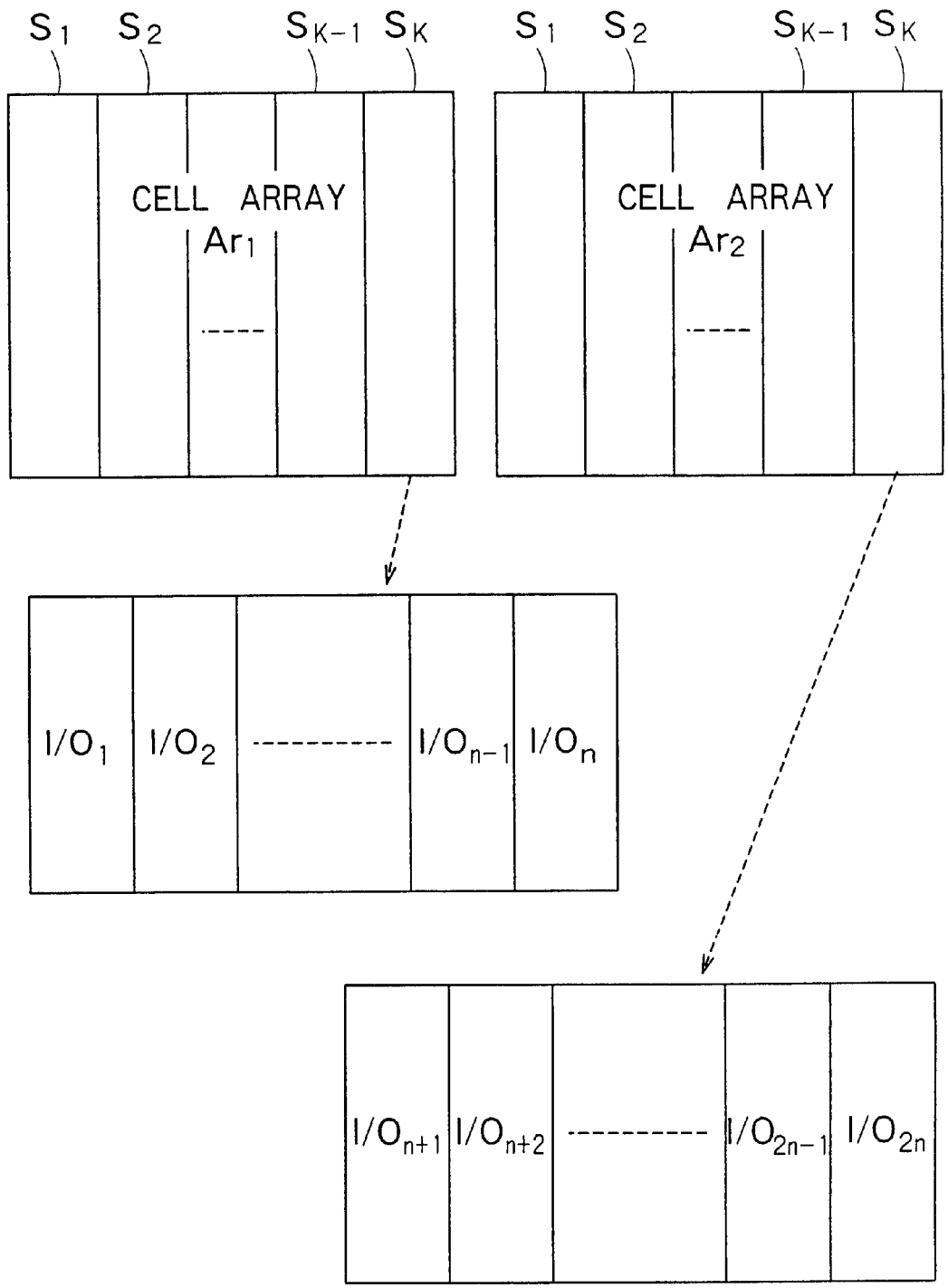
FIG. 4 is a block diagram showing the construction of a typical memory cell array of a semiconductor memory device.
Figure 5:
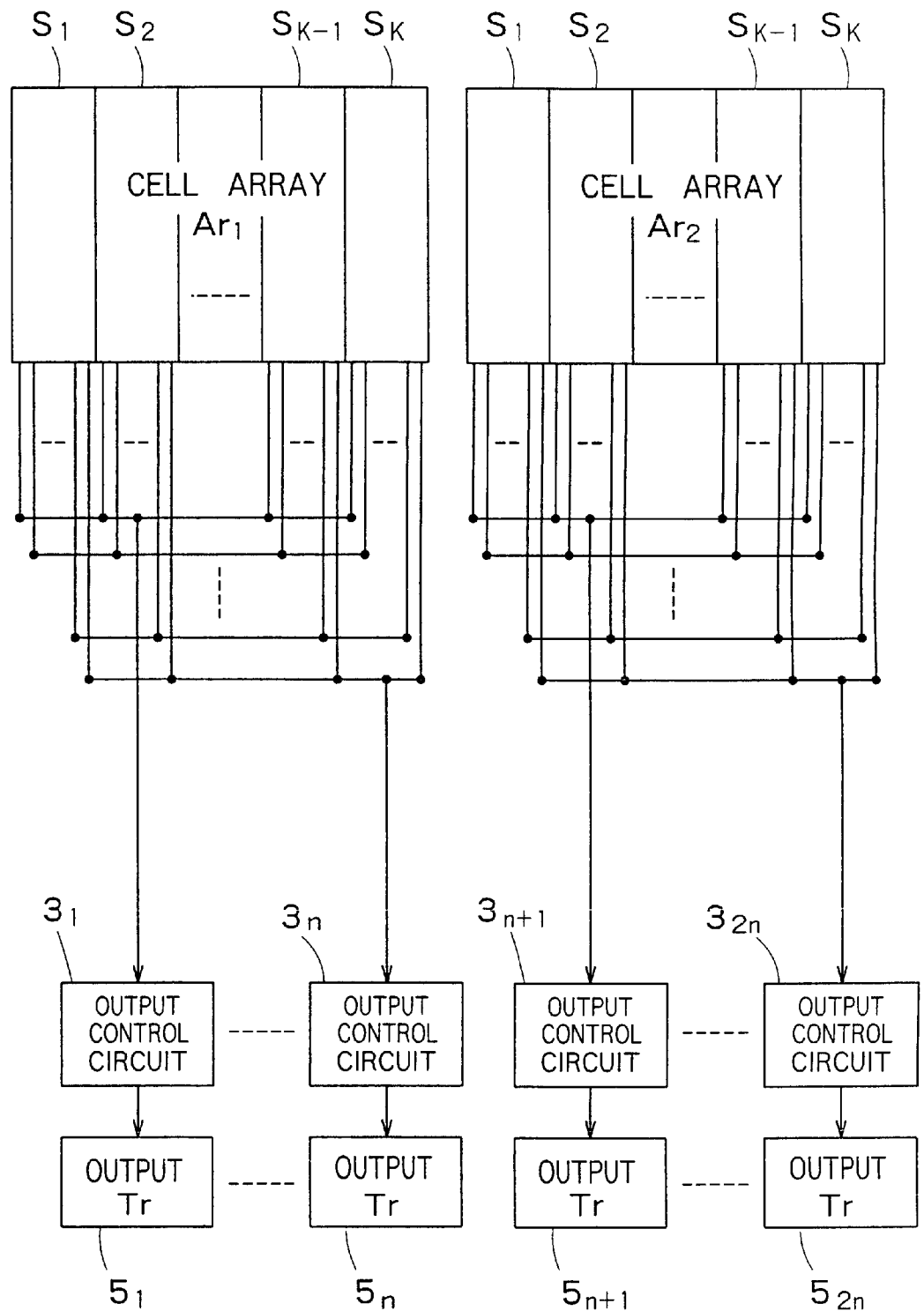
FIG. 5 is a block diagram showing the construction of a conventional semiconductor memory device.
Figure 6:
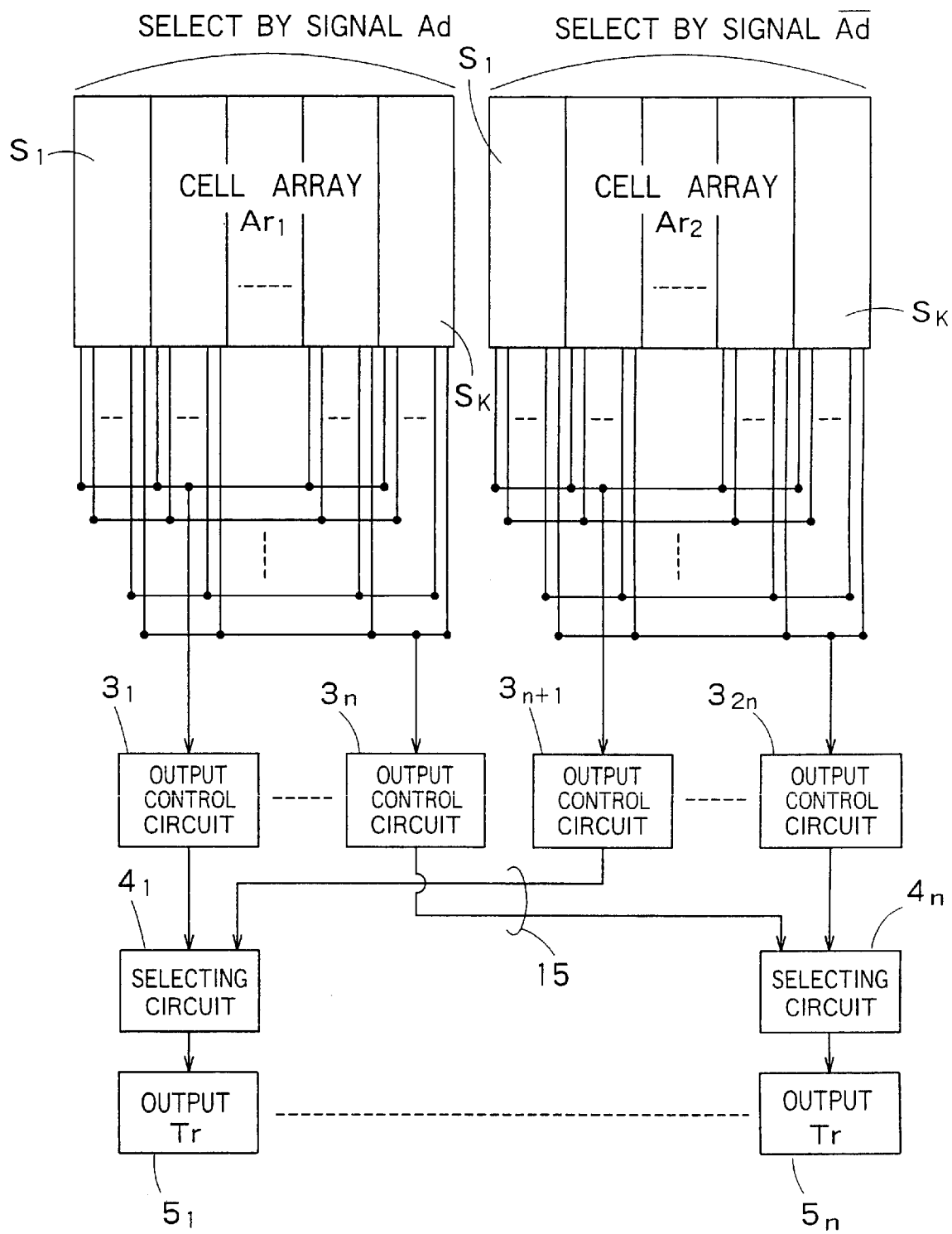
FIG. 6 is a block diagram showing the construction of another conventional semiconductor memory device.
Figure 7:
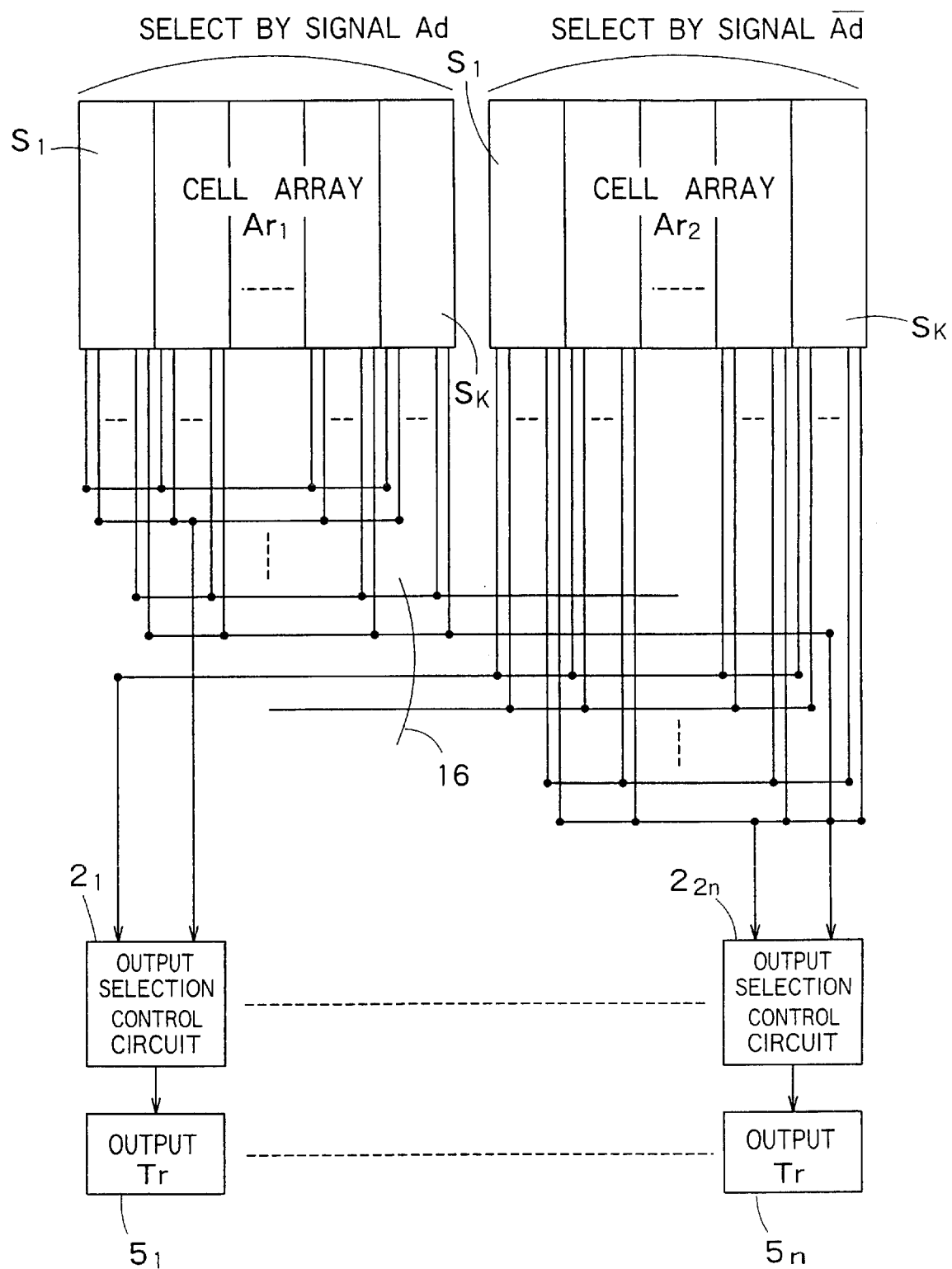
FIG. 7 is a block diagram showing the construction of a further conventional semiconductor memory device.
Figure 8:
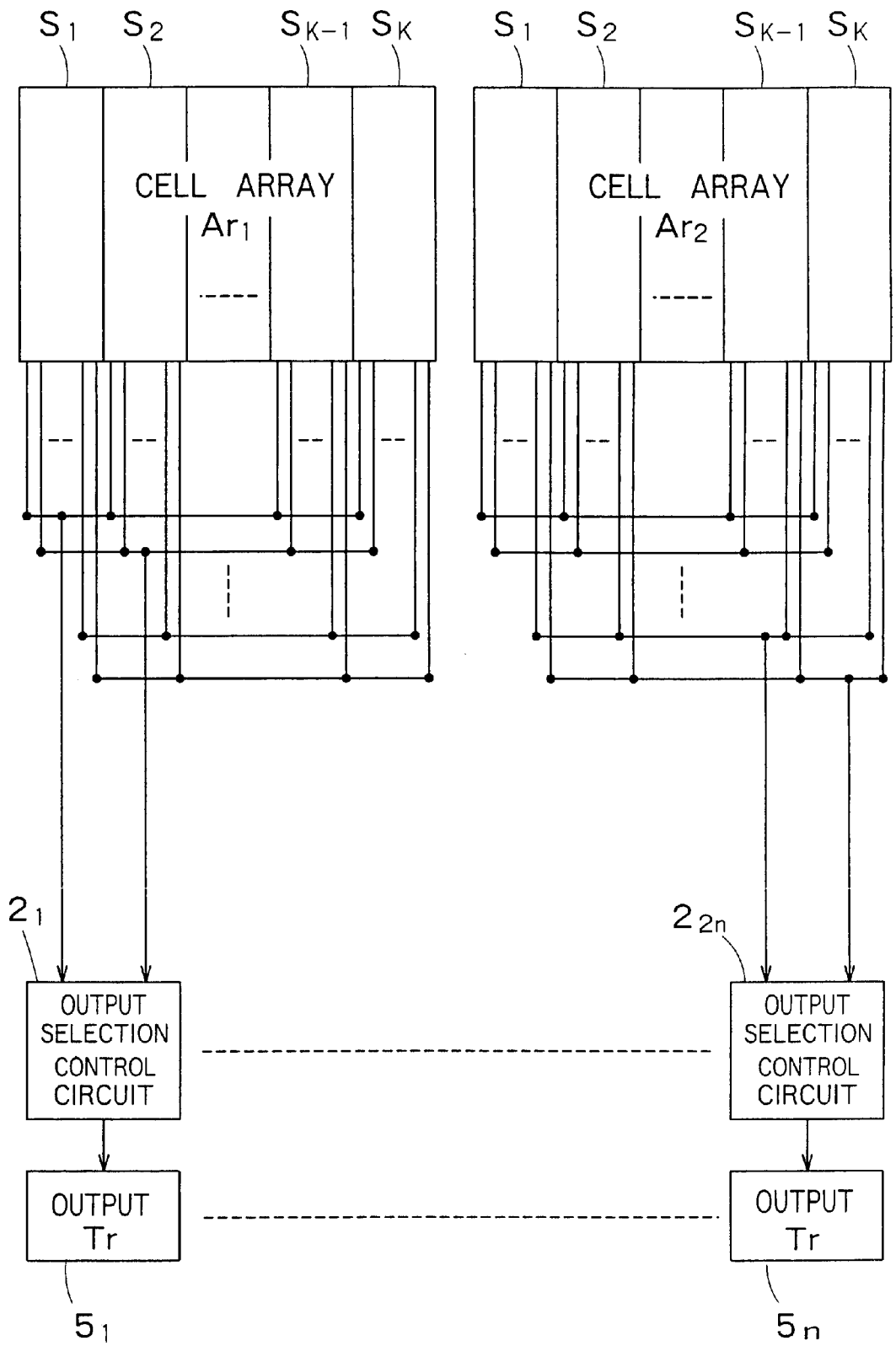
FIG. 8 is a block diagram showing the construction of a still further conventional semiconductor memory device.
Figure 9:
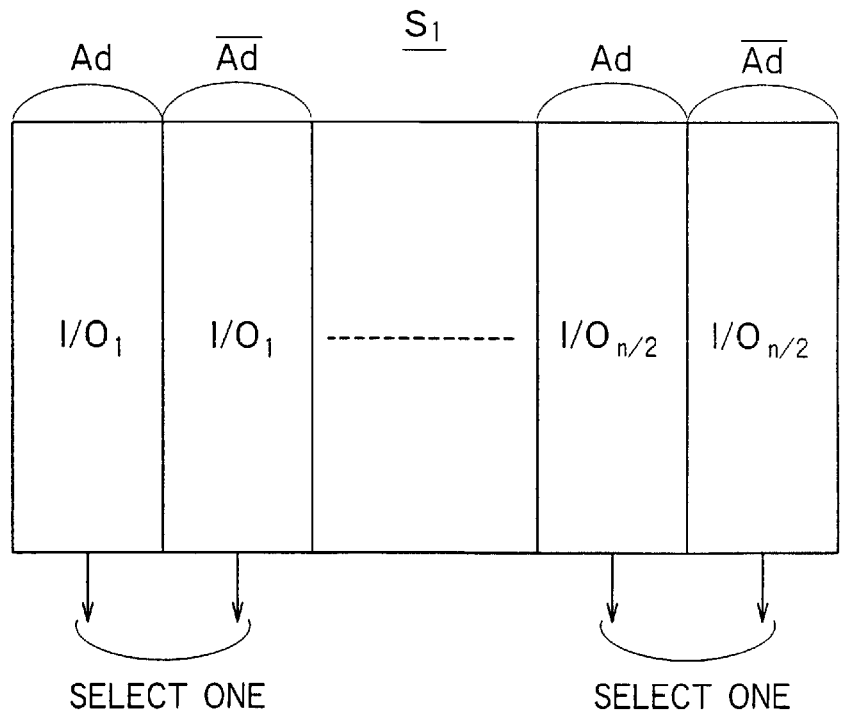
FIG. 9 is an illustration for explaining problems in the semiconductor memory device shown in FIG. 8.
Figure 10:
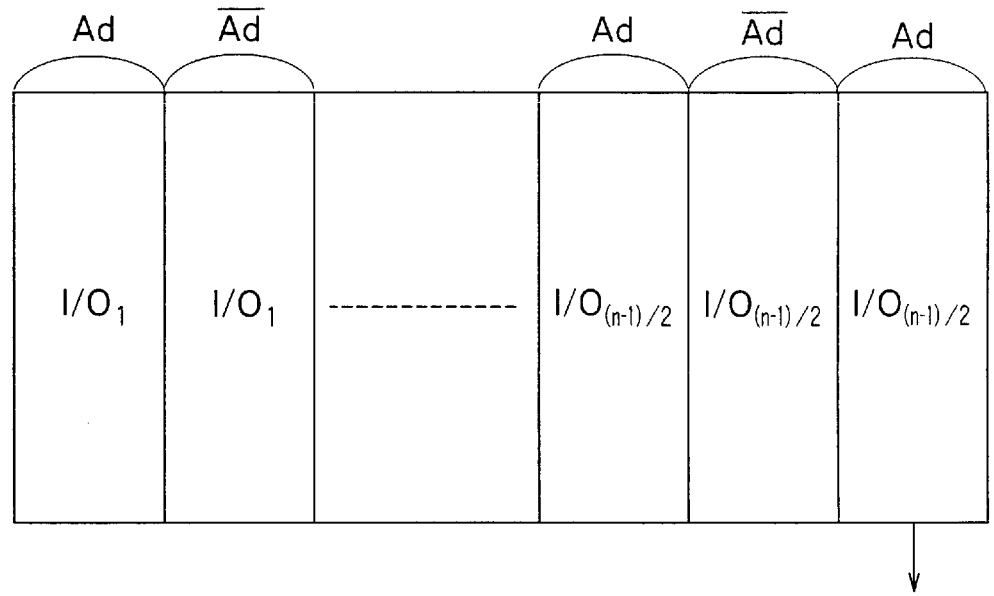
FIG. 10 is an illustration for explaining problems in the semiconductor memory device shown in FIG. 8.
Figure 11:
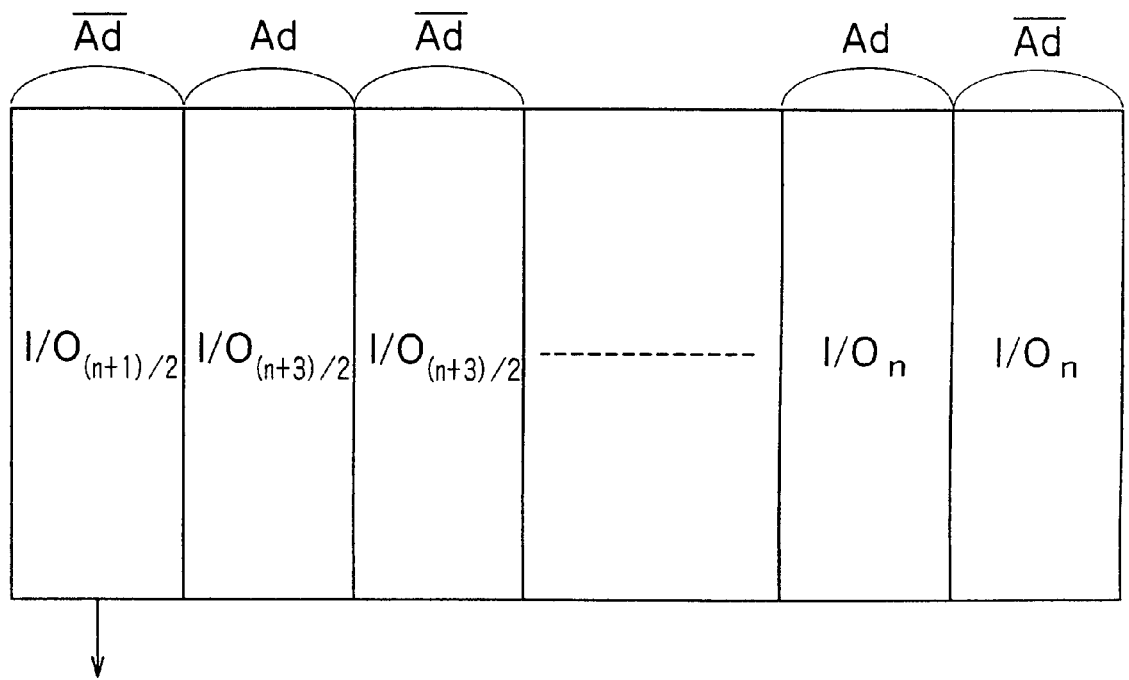
FIG. 11 is an illustration for explaining problems in the semiconductor memory device shown in FIG. 8.
Figure 12:
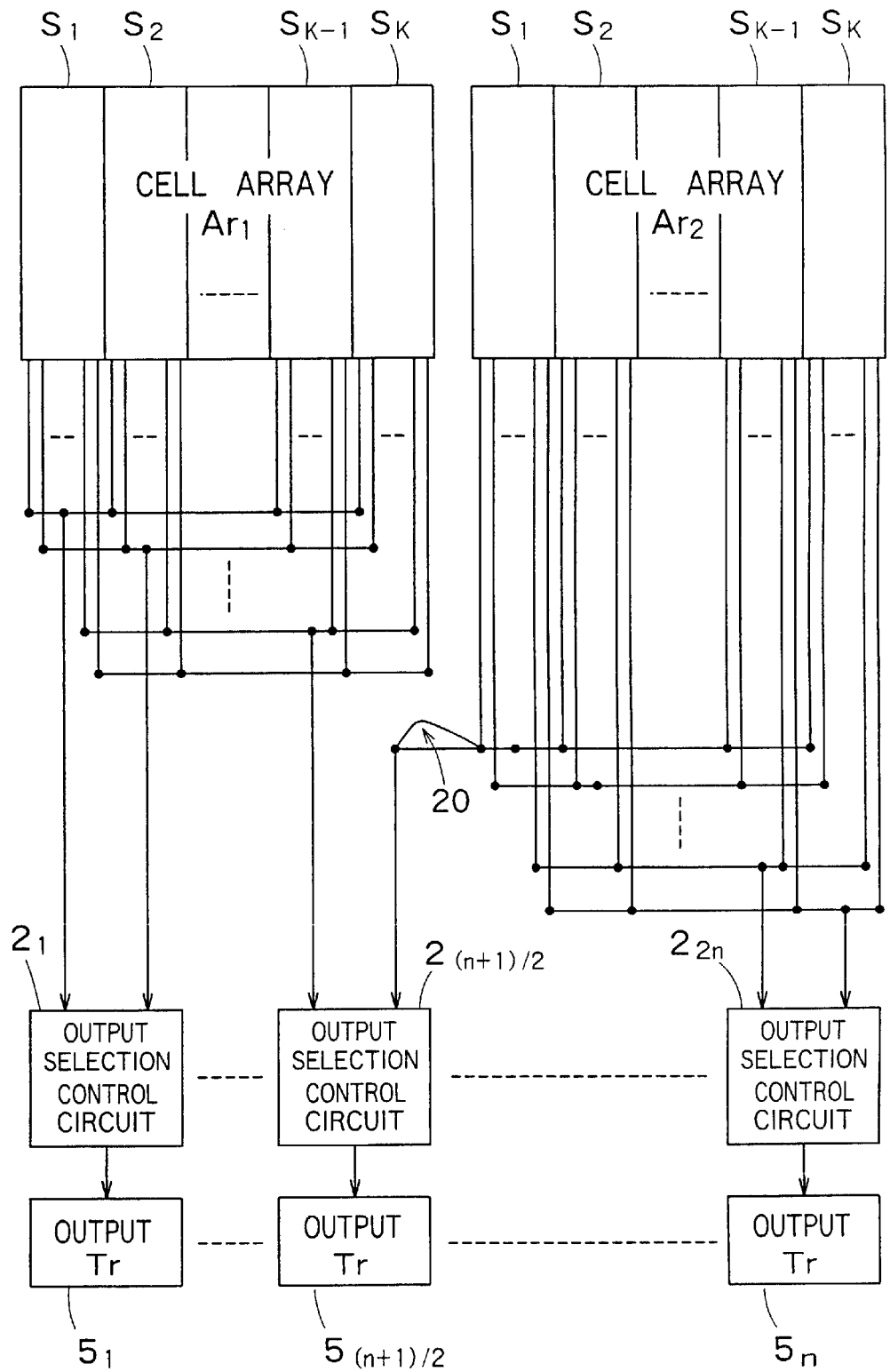
FIG. 12 is a block diagram showing the construction of another conventional semiconductor memory device.
Figure 13:
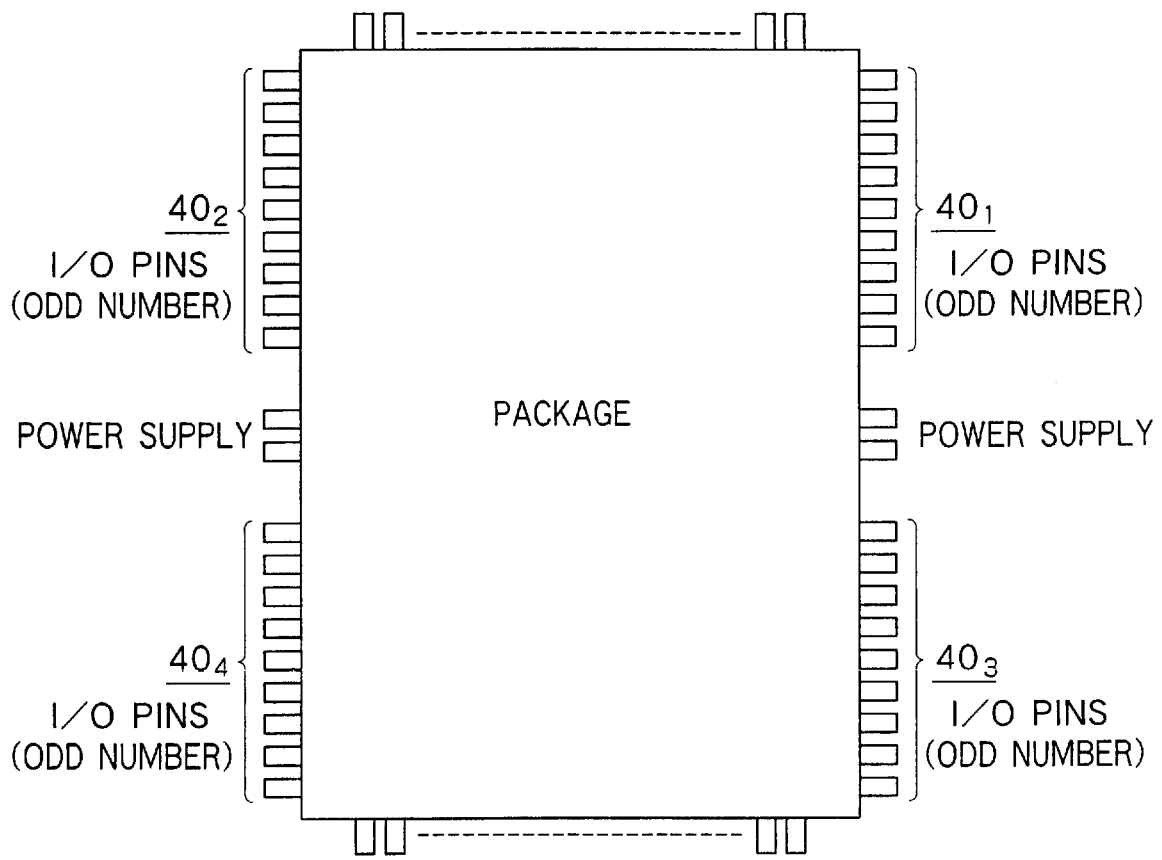
FIG. 13 is a plan view of a semiconductor package having odd I/O pins.

Referring now to the accompanying drawings, particularly to FIGS. 1 through 3, a preferred embodiment of a semiconductor memory device according to the present invention will be described below. FIG. 1 is a block diagram showing the construction of the semiconductor memory device in this preferred embodiment. FIG. 2 is a block diagram showing the construction of a section part of a cell array $A_{r1}$ in this preferred embodiment, and FIG. 3 is a block diagram showing the construction of a section part of a cell array $A_{r2}$ in this preferred embodiment.

The semiconductor memory device in this preferred embodiment comprises a memory cell array which is divided into two cell arrays $A_{r1}$ and $A_{r2}$, 2n−1 output selection control circuits $2_1, \ldots, 2_{2n-1}$, 2n−1 output transistor circuits $5_1, \ldots, 5_{2n-1}$, and first through (4n−2)-th output signal lines $SL_1, \ldots, SL_{4n-2}$. Furthermore, n denotes a natural number. In this preferred embodiment, 2n−1 output pads (not shown) are provided so as to correspond to the output transistor circuits $5_1, \ldots, 5_{2n-1}$.

Each of the cell arrays $A_{ri}$ (i=1, 2) comprises k section parts S1, . . . , Sk. As shown in FIG. 2, each of the section parts $S_j$ (j=1, . . . , k) of the cell array $A_{r1}$ comprises 2n−1 input/output parts $I/O_1, \ldots, I/O_{2n-1}$, and an auxiliary input/output part 10. Each of the input/output parts has the same number of columns, each of which comprises the same number of memory cells.

In each of the section parts $S_j$ (j=1, . . . , k), the input/output part $I/O_{2i-1}$ (i=1, . . . , n) is expressed by an input/output part $I/O_{ia}$, and the input/output part $I/O_{2i}$ (i=1, . . . , n−1) is expressed by an input/output part $I/O_{ib}$. The auxiliary input/output part 10 is expressed by an input/output part $I/O_{nb}$.

Then, in this preferred embodiment, the input/output part $I/O_{ia}$ of each of the section parts $S_j$ (j=1, . . . , k) of the cell array $A_{r1}$ is connected to the output selection control circuit $2_i$ via the (2i−1)-th output signal line $SL_{2i-1}$, and the input/output part $I/O_{ib}$ is connected to the output selection control circuit $2_i$ via the 2i-th output line $SL_{2i}$.

The output selection control circuit $2_i$ (i=1, . . . , n) is designed to determine which output of the input/output part $I/O_{ia}$ and input/output part $I/O_{ib}$ is selected, by an additional signal Ad or an additional signal /Ad which is the inverted signal of the additional signal Ad. For example, when the additional signal Ad is in an active state (="1"), the output of the input/output part $I/O_{ia}$ is selected, and when the additional signal /Ad is in an active state (="1"), the output of the input/output part $I/O_{ib}$ is selected. Then, the selected signal is transmitted to the outside via a corresponding output transistor circuit $5_i$.

As shown in FIG. 3, each of the section parts $S_j$ (j=1, . . . , k) of the cell array $A_{r2}$ comprises 2n−1 input/output parts $I/O_{2n}, \ldots, I/O_{4n-1}$, and an auxiliary input/output part 12. Similar to the cell array $A_{r1}$, each of these input/output parts has the same number of columns, each of which comprises the same number of memory cells. In each of the section parts $S_j$ (j=1, . . . , k), the input/output part $I/O_{2i}$ (i=n, . . . , 2n−2) is expressed by an input/output part $I/O_{(i+1)a}$, and the input/output part $I/O_{2i+1}$ (i=n, . . . , 2n−2) is expressed by an input/output part $I/O_{(i+1)b}$. Then, in this preferred embodiment, the input/output part $I/O_{(i+1)a}$ (i-n, . . . , 2n−2) of each of the section parts $S_j$ (j=1, . . . , k) of the cell array $A_{r2}$ is connected to the output selecting circuit $2_{i+1}$ via the 2i-th output signal line $SL_{2i}$, and the input/output part $I/O_{(i+1)b}$ is connected to the output selecting control circuit $2_{i+1}$ via the (2i+1)-th output signal line.

The output selection control circuit $2_i$ (i=n+1, . . . , 2n−1) is designed to determine which of the output of the input/output part $I/O_{ia}$ and the output of the input/output part $I/O_{ib}$ is selected, by the additional signal Ad or the additional signal /Ad. For example, when the additional signal Ad is in the active state (="1"), the output of the input/output part $I/O_{ia}$ is selected, and when the additional signal /Ad is in the active state (="1"), the output of the input/output part $I/O_{ib}$ is selected. Then, the selected signal is transmitted to the outside via a corresponding output transistor circuit $5_i$. Furthermore, the input/output part $I/O_{4n-2}$ of each of the section parts $S_j$ (j=1, . . . , k) of the cell array $A_{r2}$ and the auxiliary input/output part 12 are not used in this preferred embodiment.

As described above, in this preferred embodiment, the output signal lines $SL_i$ (i=1, ..., 4n−2) substantially have the same length, so that access characteristics are not deteriorated between output signal lines.

The semiconductor memory device in this preferred embodiment is a product having a configuration of $2W_L \times (2n-1)$.

A semiconductor memory device, which has the same memory cell array as that of the semiconductor memory device in this preferred embodiment and which has output control parts and output transistors, the numbers of which are twice as many as those in this preferred embodiment, i.e., 4n−2 (=2×(2n−1)), will be described below.

In this semiconductor memory device, the output of the input/output part $I/O_i$ (i=1, ..., 2n−1) of each of the section parts $S_j$ (j=1, ..., k) of the cell array $A_{r1}$ is transmitted to the i-th output control part via an output signal part, and then, transmitted from the i-th output control part to the outside via the i-th output transistor. In addition, the output of the input/output part $I/O_i$ (i=2n, ..., 4n−2) of each of the section parts $S_j$ (j=1, ..., k) of the cell array $A_{r2}$ is transmitted to the i-th output control part via the i-th output signal part, and then, transmitted from the i-th output control part to the outside via the i-th output transistor.

Thus, this semiconductor memory device is a product having a configuration of $W_L \times (4n-2)$.

As described above, according to the present invention, it is possible to prevent access characteristics from deteriorating between output signal lines between the respective cell arrays and the respective output selection control circuits.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:
   first and second cell arrays, each of which has the same number of memory cells;
   first through (2n−1)-th (n≧1) output selection control circuits;
   first through (2n−1)-th output transistor circuits which are provided so as to correspond to said first through (2n−1)-th output selection control circuits, and each of which receives the output of a corresponding one of said output transistor circuits; and
   first through (4n−2)-th output signal lines,
   each of said first and second cell arrays being divided into k (k≧2) first through k-th section parts, each of which has 2n−1 first through (2n−1)-th output parts and at least one auxiliary input/output part,
   said i-th (i=1, ..., n−1) output selection control part receiving the output of the (2i−1)-th input/output part of each of the first through k-th section parts of said first cell array via the (2i−1)-th output signal line, and receiving the output of the 2i-th input/output part of each of the first through k-th section parts of said first cell array via the 2i-th output signal line,
   said n-th output selection control part receiving the output of the (2n−1)-th input/output part of each of the first through k-th section parts of said first cell array via the (2n−1)-th output signal line, and receiving the output of the auxiliary input/output part of each of said section parts of said first cell array via the 2n-th output signal line, and
   said (n+i)-th (i=1, ..., n−1) output control circuit receiving the output of the (2i−1)-th input/output part of each of the first through k-th section parts of said second cell array via the (2n+2i−1)-th output signal line, and receiving the output of the 2i-th input/output part of each of the first through k-th section parts of said second cell array via the (2n+2i)-th output signal line.

2. A semiconductor memory device as set forth in claim 1, wherein said first through (2n−1)-th output selection control circuits selects one of two input signals on the basis of an additional signal, and transmits the selected signal to a corresponding one of said output transistor circuits.

* * * * *